(12) United States Patent
Chang et al.

(10) Patent No.: US 9,540,231 B2
(45) Date of Patent: Jan. 10, 2017

(54) MEMS DEVICE WITH A BONDING LAYER EMBEDDED IN THE CAP

(71) Applicant: Taiwan Semiconductor Manufacturing Co., Ltd, Hsin-Chu (TW)

(72) Inventors: Kai-Fung Chang, Taipei (TW); Lien-Yao Tsai, Hsinchu (TW); Len-Yi Leu, Hsinchu (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 67 days.

(21) Appl. No.: 14/166,492

(22) Filed: Jan. 28, 2014

(65) Prior Publication Data

US 2015/0210537 A1 Jul. 30, 2015

(51) Int. Cl.
*B81B 7/00* (2006.01)
*B81C 1/00* (2006.01)
*B81B 3/00* (2006.01)

(52) U.S. Cl.
CPC ......... *B81C 1/00269* (2013.01); *B81B 3/0051* (2013.01); *B81C 2203/0109* (2013.01); *B81C 2203/019* (2013.01)

(58) Field of Classification Search
CPC .. B81B 7/0051; B81B 3/0051; B81C 1/00595; B81C 1/00269; B81C 2203/0109; B81C 2203/019

USPC .......................................................... 257/704
See application file for complete search history.

(56) References Cited

U.S. PATENT DOCUMENTS

| | | | |
|---|---|---|---|
| 2004/0200736 A1* | 10/2004 | Van Heerden | B65D 77/10 206/1.5 |
| 2006/0115323 A1* | 6/2006 | Coppeta et al. | 403/270 |
| 2006/0197215 A1* | 9/2006 | Potter | 257/704 |
| 2010/0258884 A1* | 10/2010 | Gonska | B81C 3/001 257/415 |
| 2012/0148870 A1* | 6/2012 | Liu et al. | 428/641 |
| 2013/0068022 A1* | 3/2013 | Jeung et al. | 73/514.29 |
| 2013/0203199 A1* | 8/2013 | Huang | B23K 20/023 438/51 |
| 2013/0285175 A1* | 10/2013 | Gonska | B81C 1/00269 257/417 |
| 2014/0124899 A1* | 5/2014 | Gooch et al. | 257/620 |
| 2014/0131850 A1* | 5/2014 | Chen et al. | 257/684 |

* cited by examiner

*Primary Examiner* — Peter Bradford
(74) *Attorney, Agent, or Firm* — Birch, Stewart, Kolasch & Birch, LLP

(57) ABSTRACT

Embodiments of a semiconductor device structure are provided. The semiconductor device structure includes a cap structure. The cap structure includes: a first bonding layer and a cap substrate, and the first bonding layer is embedded in the cap substrate. The semiconductor device structure also includes a substrate structure. The substrate structure includes a substrate and a second bonding layer formed on the substrate. The substrate includes a micro-electro-mechanical system (MEMS) substrate or a semiconductor substrate. The cap structure is bonded to the substrate structure by bonding the first bonding layer and the second bonding layer.

20 Claims, 15 Drawing Sheets

MEMS DEVICE WITH A BONDING LAYER EMBEDDED IN THE CAP

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, or in other types of packaging, for example.

Micro-electro mechanical system (MEMS) devices have recently been developed. MEMS devices include devices fabricated using semiconductor technology to form mechanical and electrical features. Examples of the MEMS devices include gears, levers, valves, and hinges. The MEMS devices are implemented in accelerometers, pressure sensors, microphones, actuators, mirrors, heaters, and/or printer nozzles.

Although existing devices and methods for forming the MEMS devices have been generally adequate for their intended purposes, they have not been entirely satisfactory in all respects.

BRIEF DESCRIPTION OF THE DRAWINGS

For a more complete understanding of the illustrative embodiments and the advantages thereof, reference is now made to the following descriptions taken in conjunction with the accompanying drawings.

DETAILED DESCRIPTION OF THE ILLUSTRATIVE EMBODIMENTS

The making and using of various embodiments of the disclosure are discussed in detail below. It should be appreciated, however, that the various embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description may include embodiments in which the first and second features are formed in direct or indirect contact.

Some variations of the embodiments are described. Throughout the various views and illustrative embodiments, like reference numbers are used to designate like elements. It is understood that additional operations can be provided before, during, and after the method, and some of the operations described can be replaced or eliminated for other embodiments of the method.

FIGS. 1A-1I show cross-sectional representations of various stages of forming a cap structure 100, in accordance with some embodiments of the disclosure.

Figure 1A:
FIGS. 1A-1I show cross-sectional representations of various stages of forming a cap structure, in accordance with some embodiments of the disclosure.

Referring to FIG. 1A, a cap substrate 102 is provided. In some embodiments, cap substrate 102 is made of silicon or other elementary semiconductor. In some embodiments, cap substrate 102 is made of silicon carbide, gallium arsenic, indium arsenide, indium phosphide, or other applicable materials.

Afterwards, a first photoresist (PR) layer 120 is formed on cap substrate 102. In some embodiments, first PR layer 120 is a positive resist (positive tone resist). The positive resist is characterized by the exposed regions becoming more soluble in a developer solution.

Figure 1B:
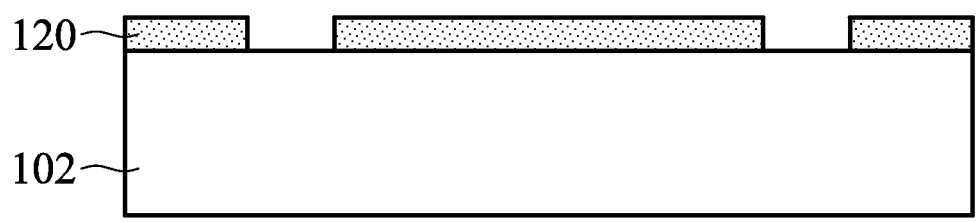

After first photoresist layer 120 is formed, first photoresist layer 120 is patterned by a patterning process to form a patterned first photoresist layer 120 as shown in FIG. 1B in accordance with some embodiments of the disclosure. The patterning process includes a photolithography process and an etching process. The photolithography processes include photoresist coating (e.g., spin-on coating), soft baking, mask aligning, exposure, post-exposure baking, developing the photoresist, rinsing, drying (e.g., hard baking). The etching process includes a dry etching process or a wet etching process.

Figure 1C:
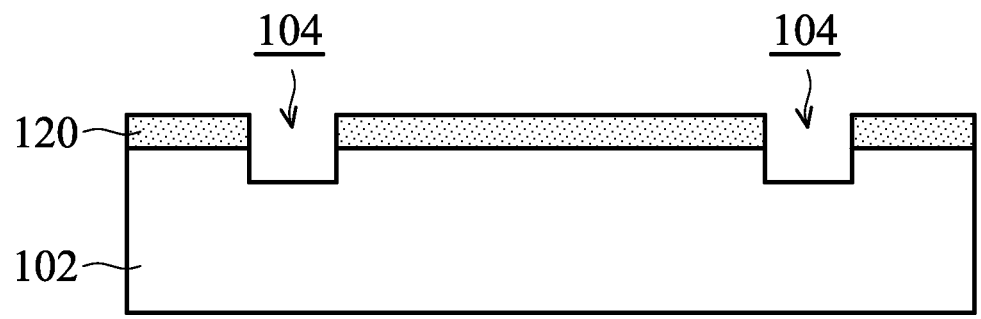

After patterned first photoresist layer 120 is formed, a portion of cap substrate 102 is removed by using patterned first photoresist layer 120 as a mask as shown in FIG. 1C in accordance with some embodiments of the disclosure. As a result, trenches 104 are formed in cap substrate 102. In some embodiments, cap substrate 102 is removed by a dry etching process or a wet etching process.

Figure 1D:
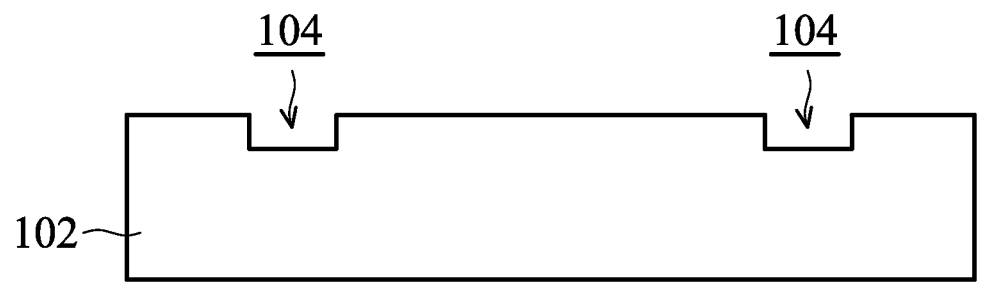

After a portion of cap substrate 102 is removed, patterned first photoresist layer 120 is removed as shown in FIG. 1D in accordance with some embodiments of the disclosure. In some embodiments, patterned first photoresist layer 120 is removed by a dry etching process or a wet etching process.

Figure 1E:
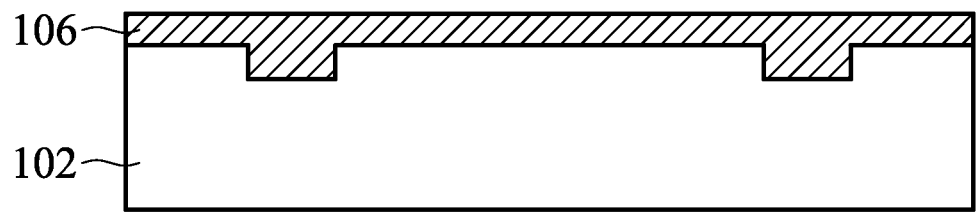

After patterned first photoresist layer 120 is removed, bonding material 106 is filled into trenches 104 and on cap substrate 102 as shown in FIG. 1E in accordance with some embodiments of the disclosure. In some embodiments, bonding material 106 is made of eutectic material, such as germanium (Ge), aluminum (Al), copper (Cu), titanium (Ti), nickel (Ni), silver (Ag), gold (Au), indium (In), tin (Sn) or silicon (Si).

Figure 1F:
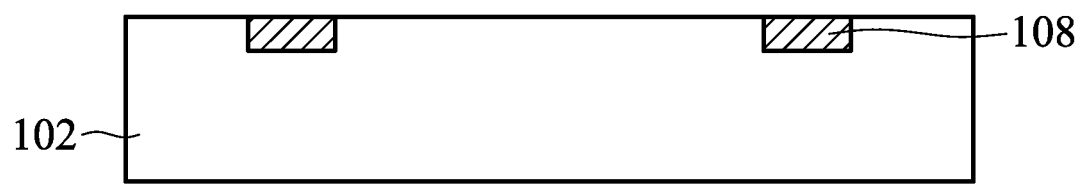

After bonding material 106 is formed, a planarization process is performed to remove the excess of bonding material 106 as shown in FIG. 1F in accordance with some embodiments of the disclosure. As a result, first bonding layer 108 is formed. In some embodiments, a top surface of first bonding layer 108 is substantially level with a top surface of cap substrate 102. In some embodiments, planarization process is a chemical polishing (CMP) process.

Figure 1G:
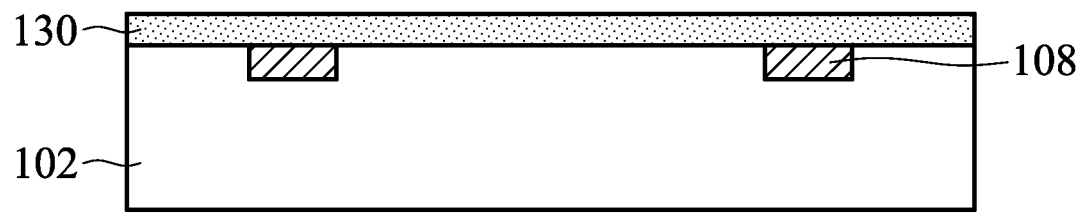

After the planarization process is performed, a second photoresist layer 130 is formed on first bonding layer 108 and cap substrate 102 as shown in FIG. 1G in accordance with some embodiments of the disclosure.

Figure 1H:
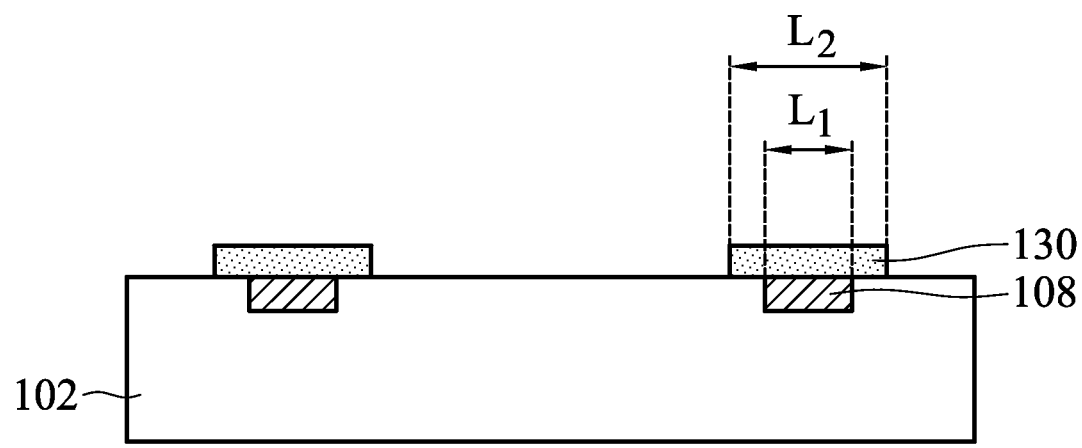

After second photoresist layer 130 is formed, second photoresist layer 130 is patterned by a patterning process to form a patterned second photoresist layer 130 as shown in FIG. 1H in accordance with some embodiments of the disclosure. Patterned second photoresist layer 130 is used to protect underlying first bonding layer 108 from being etched. In some embodiments, patterned second photoresist layer 130 covers first bonding layer 108 and a portion of cap substrate 102.

Figure 1I:
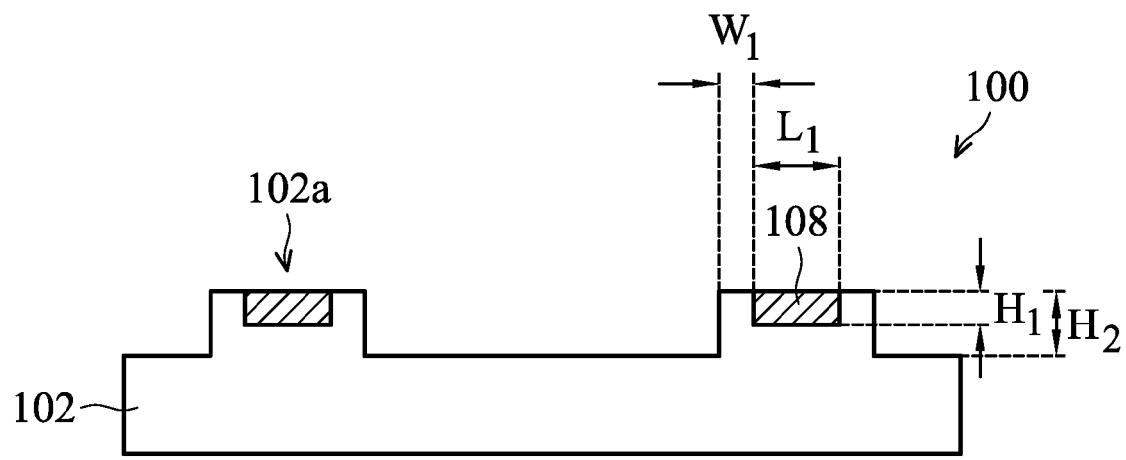

After patterned second photoresist layer 130 is formed, an etching process is performed to remove unmasked regions as shown in FIG. 1I in accordance with some embodiments of the disclosure. As a result, first bonding layer 108 is formed in an extending portion 102a of cap substrate 102. Afterwards, patterned second photoresist layer 130 is removed and cap structure 100 is formed.

It should be noted that first bonding layer 108 is embedded in cap substrate 102. In some embodiments, first bonding layer 108 is made of germanium (Ge), and cap substrate 102 is made of silicon (Si). Therefore, germanium (Ge) is surrounded by silicon (Si).

It should be noted that a length $L_2$ of patterned second photoresist layer 130 is larger than a length $L_1$ of first bonding layer 108. Therefore, a portion of cap substrate 102 underlying patterned photoresist layer 130 is not removed. As a result, an embedded first boning layer 108 is formed. In some embodiments, patterned second photoresist layer 130 has the length $L_2$ in a range from about 2 μm to about 2000 μm. In some embodiments, first bonding layer 108 has the length $L_1$ in a range from about 1 μm to about 1000 μm. In some embodiments, a ratio ($L_2/L_1$) of the length $L_2$ to the length $L_1$ is in a range from about 1 to about 5.

First bonding layer 108 is surrounded by extending portion 102a of cap substrate 102. In some embodiments, a height of extending portion 102a is substantially equal to a height of first bonding layer 108. In some embodiments, a distance $W_1$ between an edge of first bonding layer 108 and an edge of extending portion 102a is in a range from about 0.1 μm to about 1000 μm. In some embodiments, first bonding layer 108 has a height $H_1$ in a range from about 0.1 μm to about 400 μm. In some embodiments, the extending portion 102a has a height ($H_2$). In some embodiments, the height ($H_2$) of extending portion 102a is greater than the height ($H_1$) of first bonding layer 108.

In some embodiments, a ratio ($L_1/H_1$) of the length $L_1$ to the height $H_1$ is in a range from about 0.0025 to about 10000. In some embodiments, a ratio ($W_1/L_1$) of the distance $W_1$ to the length $L_1$ is in a range from about 0.0001 to about 200.

Figure 2:
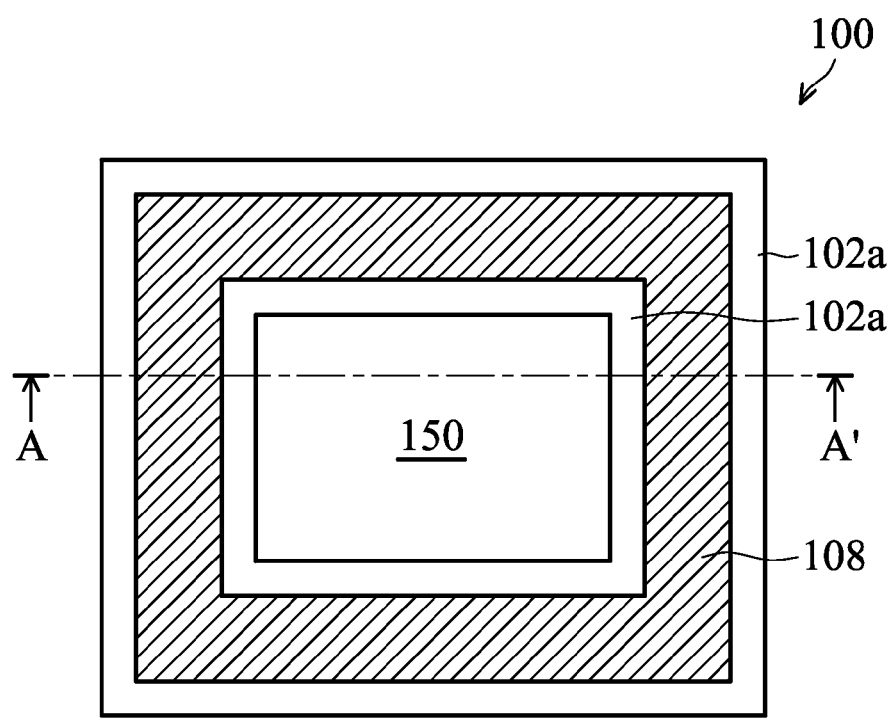
FIG. 2 shows a top-view of a cap structure, in accordance with some embodiments of the disclosure.

FIG. 2 shows a top-view of a cap structure 100, in accordance with some embodiments of the disclosure. FIG. 1I is a top-view taken along AA' line of FIG. 2. As shown in FIG. 2, first bonding layer 108 and extending portion 102a respectively have a ring structure to form a cavity 150. First bonding layer 108 is sandwiched by extending portion 102a of cap substrate 102. In a top view, first bonding layer 108 and extending portion 102a form three concentric rings. The concentric rings may have a shape that is a circle, rectangle, ellipse, square, or polygon when seen from a top view.

Figure 3A:
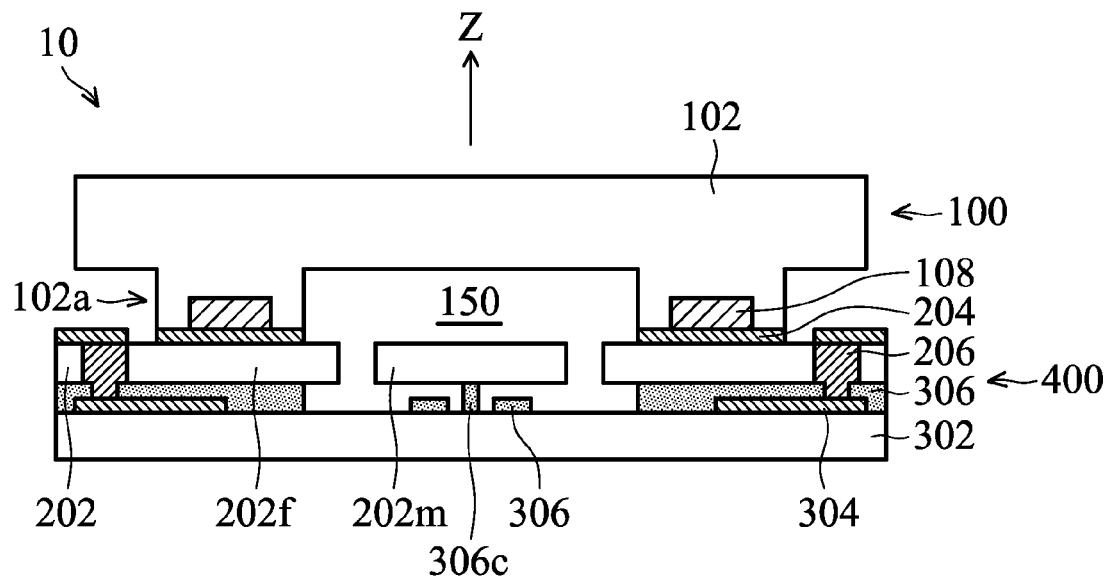
FIGS. 3A-3E show cross-sectional representations of a semiconductor device structure, in accordance with some embodiments of the disclosure.

FIG. 3A shows a cross-sectional representation of a semiconductor device structure 10, in accordance with some embodiments of the disclosure. Semiconductor device structure 10 includes cap structure 100 obtained from FIG. 1I and a substrate structure 400. Substrate structure 400 is bonded to cap structure 100. Substrate structure 400 includes a semiconductor substrate 302 and a micro-electro-mechanical system (MEMS) substrate 202.

Cap structure 100 is configured to provide a protection purpose for MEMS substrate 202. In some embodiments, cap substrate 102 includes extending portion 102a (or called stand-off features) to enclose and provide cavity 150 for the MEMS devices. In some embodiments, cap structure 100 does not include an integrated circuit.

MEMS substrate 202 may be a silicon wafer including MEMS devices, features and/or functionalities. In some embodiments, MEMS substrate 202 includes a number of MEMS devices. MEMS substrate 202 may alternatively or additionally include other elementary semiconductor, such as germanium (Ge). MEMS substrate 202 may also include a compound semiconductor, such as silicon carbide, gallium arsenic, indium arsenide, indium phosphide, or the like.

As shown in FIG. 3A, MEMS substrate 202 includes a movable element 202m and fixed element 202f. Movable element 202m is also called as a proof mass. Movable element 202m is supported by middle third bonding layer 306c. In some embodiments, movable element 202m is made of silicon-containing material, such as polysilicon, amorphous silicon, or crystalline silicon.

MEMS substrate 202 has a first surface facing cap structure 100 and a second surface facing semiconductor substrate 302. In some embodiments, a second bonding layer 204 is formed on the first surface of MEMS substrate 202. In some embodiments, a third bonding layer 306 is formed on semiconductor substrate 302, and a metal layer 304 is formed in third bonding layer 306. A through-silicon-via (TSV) 206 is formed in MEMS substrate 202 to electrically connect second bonding layer 204 to metal layer 304. Third bonding layer 306 is used as an insulating layer.

Second bonding layer 204 includes germanium (Ge), aluminum (Al), copper (Cu), titanium (Ti), nickel (Ni), silver (Ag), gold (Au), indium (In), tin (Sn), silicon (Si) or combinations thereof. Second bonding layer 204 is formed by a chemical vapor deposition (CVD) process or a physical vapor deposition (PVD) process, plating or other applicable processes. The patterns of second bonding layer 204 are defined by a photolithography process and an etching process. In some embodiments, second bonding layer 204 is a part of an interconnect structure. The interconnect structure includes conductive features, such as conductive lines, vias, or conductive pads, formed in an insulating material.

Semiconductor substrate 302 includes a semiconductor device such as an integrated circuit (IC). The IC includes complementary MOSFET (CMOS), a CMOS imaging sensor (CIS), a MEMS, and/or other applicable active and/or passive devices. In some embodiment, semiconductor substrate 302 includes an IC (or portion thereof) designed and formed by a CMOS-based processes. Semiconductor substrate 302 including a device formed using other semiconductor fabrication technologies is also within the scope of the described method and present disclosure. In some embodiments, semiconductor substrate 302 is a silicon wafer. Semiconductor substrate 302 may alternatively or additionally include other elementary semiconductor, such as germanium (Ge). Semiconductor substrate 302 may also include a compound semiconductor, such as silicon carbide, gallium arsenic, indium arsenide, indium phosphide, or the like.

Metal layer 304 includes aluminum (Al), copper (Cu), titanium (Ti), nickel (Ni), silver (Ag), gold (Au), indium (In), tin (Sn), or combinations thereof. Meatl layer 304 is formed by a chemical vapor deposition (CVD) process or a physical vapor deposition (PVD) process, plating or other applicable processes. In some embodiments, metal layer 304 is a part of an interconnect structure. The interconnect structure includes conductive features, such as conductive lines, vias, or conductive pads, formed in an insulating material.

In some embodiments, third bonding layer 306 is made of dielectric layer, such as silicon oxide, silicon nitride, silicon oxynitride, spin-on glass (SOG), low-k material, fluoride-doped silicate glass (FSG), carbon doped silicon oxide or other applicable materials. In some embodiments, third bonding layer 306 includes multiple dielectric layers of dielectric materials.

As shown in FIG. 3A, substrate structure 400 is bonded to cap structure 100 by bonding first bonding layer 108 and second bonding layer 204. More specifically, cap substrate 102 is bonded to MEMS substrate 202 by bonding first bonding layer 108 and second bonding layer 204. In some embodiments, the bonding is performed through an eutectic bonding process. The eutectic bonding process is performed with a bonding force at a certain temperature. As a result, an eutectic alloy is formed from first bonding layer 108 and second bonding layer 204.

During the eutectic bonding process, melted alloy has a liquid phase which is easily spilled out. Therefore, a portion of first bonding layer 108 and/or second bonding layer 204 may be squeezed by the bonding force. In addition, first bonding layer (such as Ge) 108 is easily oxidized and hydrolyzed when it is exposed. The squeezing, oxidation and hydrolysis problems may affect the quality and reliability of semiconductor device structure 10.

In order to solve the above problems, first bonding layer 108 is surrounded by cap substrate 102. In other words, there is a distance $W_1$ between the edge of first bonding layer 108 and the edge of extending portion 102a. More specifically, the edge of first bonding layer 108 is not aligned with the edge of extending portion 102a. When the eutectic bonding process is performed, the melted alloy with the liquid phase between first bonding layer 108 and second bonding layer 204 is blocked by cap substrate 102. Therefore, squeezing problem is avoided. In other words, cap substrate 102 prevents the melted alloy from spilling out. In addition, due to the protection of cap substrate 102 and extending portion 102a, first bonding layer 108 is prevented from being oxidized and hydrolyzed.

In some embodiment, the eutectic bonding process is performed at a temperature depending on an eutectic temperature of first bonding layer 108 and second bonding layer 204. In some embodiments, the bonding temperature is higher than the eutectic temperature in a range from about 1 fold to about 1.1 folds. In some embodiments, when first bonding layer 108 is made of germanium (Ge), second bonding layer 204 is made of aluminum (Al), the eutectic bonding process is performed at a temperature in a range from about 420° C. to about 460° C. In some embodiment, the eutectic bonding process is performed at a pressure in a range from about 30 kN to about 300 kN. The eutectic bonding process may be performed in a controlled atmosphere (e.g., in the presence of a forming gas). Example forming gases include Ar, $N_2$, $H_2$, He, $N_2/H_2$, or combinations thereof. An alignment process is performed prior to the eutectic bonding process.

In some embodiments, a surface cleaning process is performed prior to the eutectic bonding process. The surface clean process may include a wet etching process, a dry etching process, or combinations thereof. For example, the wet etching process includes exposure to hydrofluoric acid (HF). The dry etching process includes argon sputtering and plasma etching process. In some embodiments, a post-bonding thermal process is performed.

FIGS. 3B-3E show cross-sectional representations of a semiconductor device structure 10, in accordance with some embodiments of the disclosure.

Figure 3B:
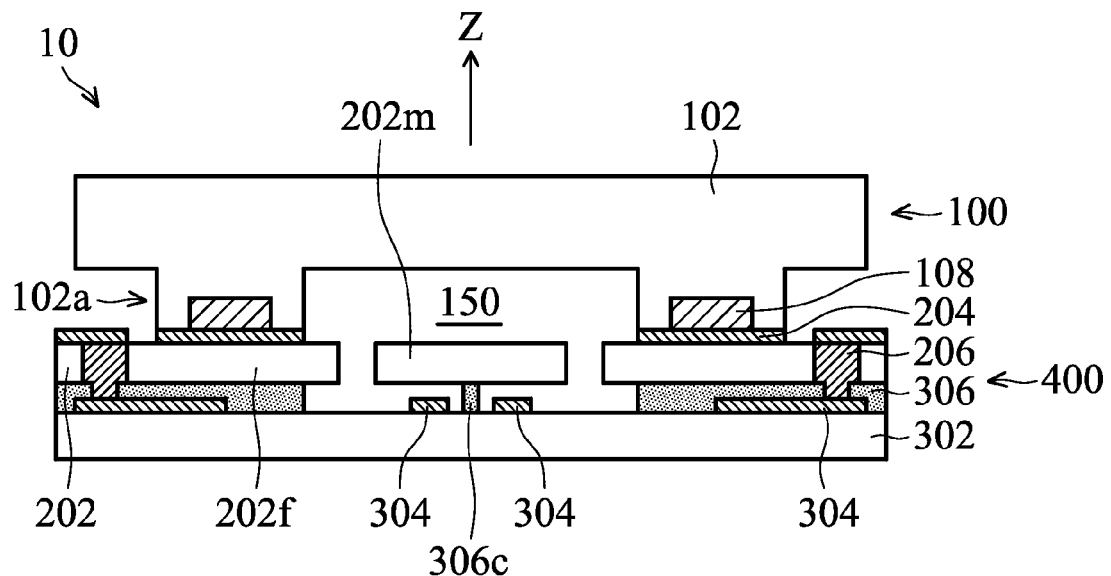

As shown in FIG. 3B, movable element 202m is supported by a middle third bonding layer 306c. Two metal layers 304 are formed adjacent to middle third bonding layer 306c and on semiconductor substrate 302. Two metal layers 304 below middle third bonding layer 306c are used as stoppers. The stoppers are configured to prevent movable element 202m from moving too far in the Z-direction and contacting other components or parts during a shock event.

Figure 3C:
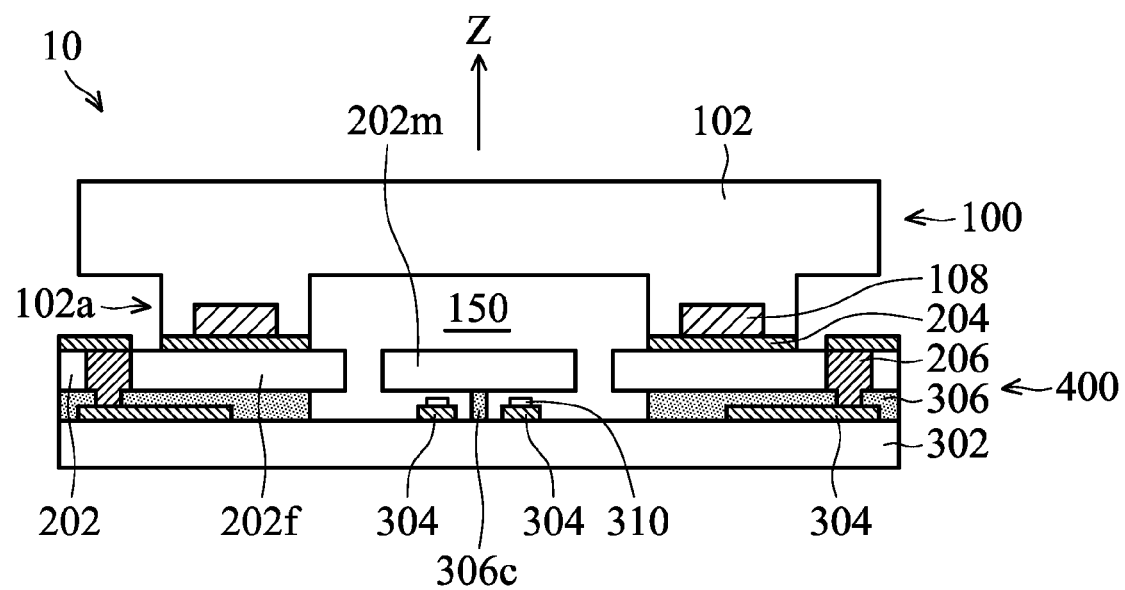

As shown in FIG. 3C, an oxide layer 310 is formed on metal layer 304. Oxide layer 310 is used as the stopper. A capacitor structure is constructed by metal layer 304, oxide layer 310 and movable element 202m. On the left side of middle third bonding layer 306c, a first capacitor structure is formed. On the right side of middle third bonding layer 306c, a second capacitor structure is formed. An acceleration difference between the left side and right side of movable element 202m is obtained by determining the capacitance differences between the first capacitor structure and the second capacitor structure.

Figure 3D:
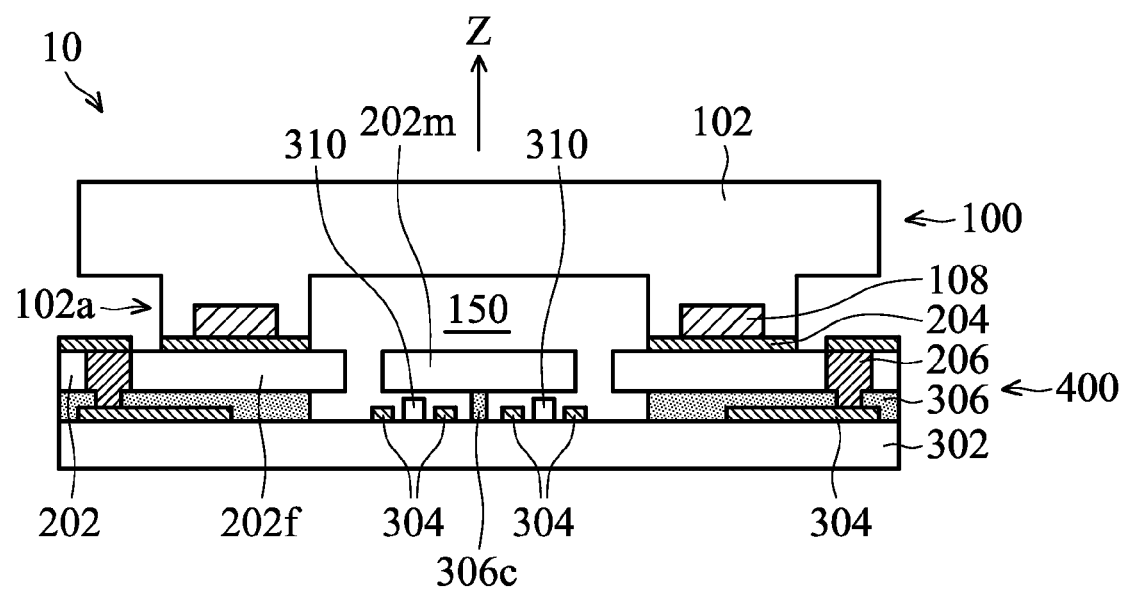

As shown in FIG. 3D, one oxide layer 310 is disposed between two metal layers 304. Therefore, capacitor structure is constructed by two metal layers 304 and one oxide layer 310. Similar to FIG. 3C, on the left side of middle third bonding layer 306c, a first capacitor structure is formed. On the right side of middle third bonding layer 306c, a second capacitor structure is formed. Therefore, an acceleration difference between the left side and right side of movable element 202m is obtained by determining the capacitance differences between the first capacitor structure and the second capacitor structure. In FIG. 3C, oxide layer 310 is formed on metal layer 304, but in FIG. 3D, oxide layer 310 is formed between two metal layers 304.

Figure 3E:
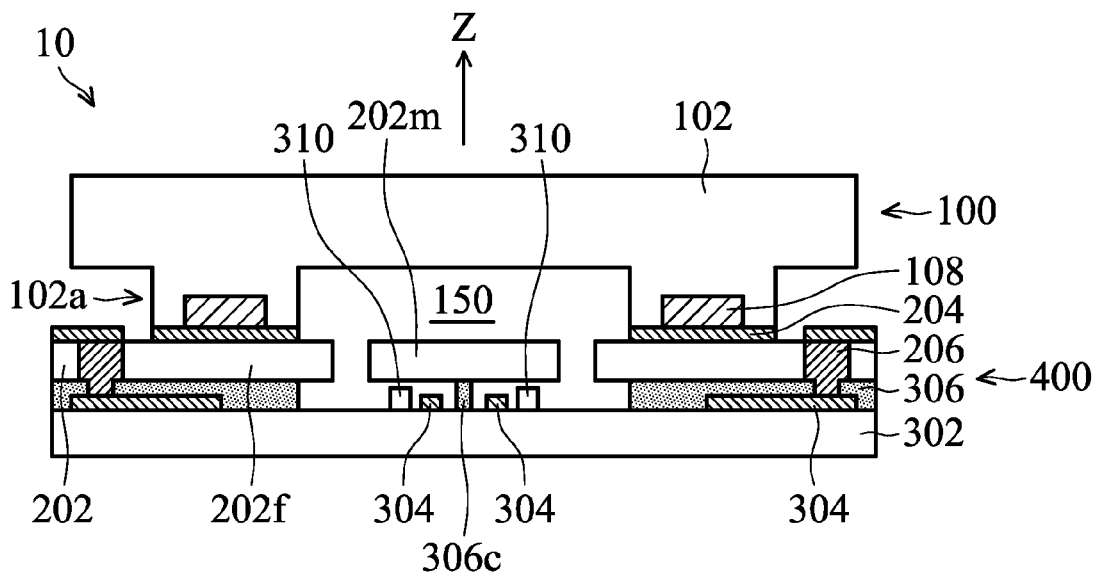

As shown in FIG. 3E, on the left side of middle third bonding layer 306c, oxide layer 310 is formed adjacent to metal layer 304. On the right side of middle third bonding layer 306c, another oxide layer 310 is formed adjacent to another metal layer 304. A capacitor structure is constructed by two metal layers 304 and movable element 202m. Oxide layer 310 in FIG. 3E is also used as the stopper.

Figure 4A:
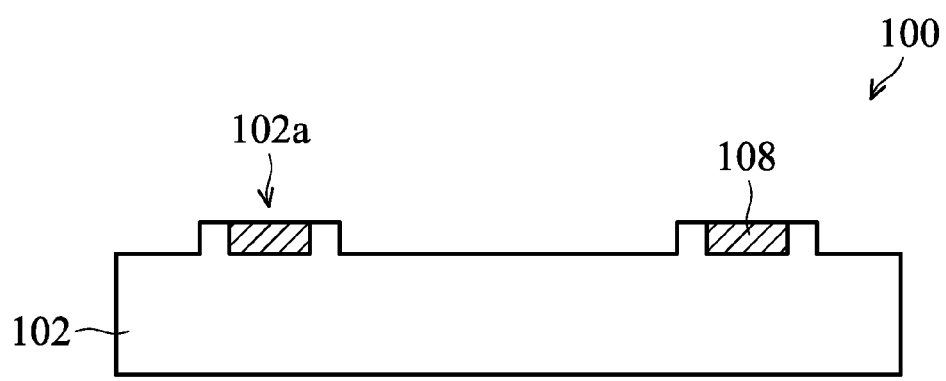
FIGS. 4A-4D show cross-sectional representations of various stages of forming a cap structure, in accordance with some embodiments of the disclosure.

FIGS. 4A-4D show cross-sectional representations of various stages of forming a cap structure 100', in accordance with some embodiments of the disclosure. The structure in FIG. 4A is the same as the structure in FIG. 1I. First bonding layer 108 is embedded in cap substrate 102.

Figure 4B:
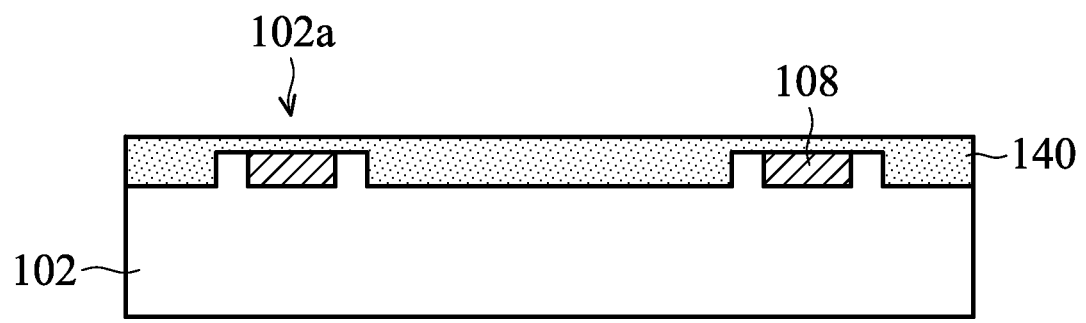

Afterwards, a third photoresist layer 140 is formed on first bonding layer 108 and cap substrate 102 as shown in FIG. 4B in accordance with some embodiments of the disclosure.

Figure 4C:
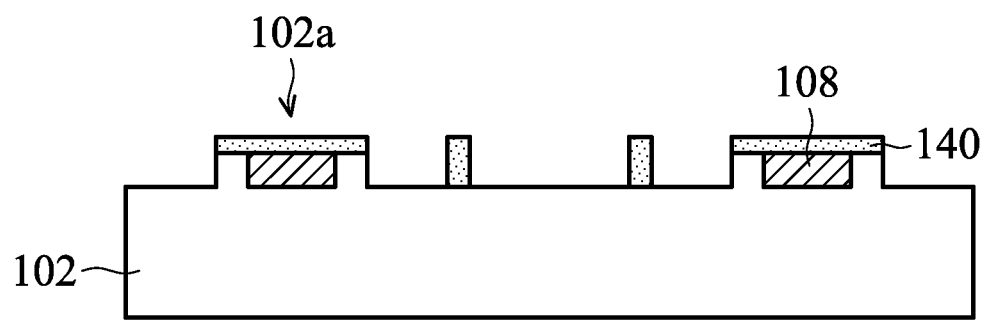

After third photoresist layer 140 is formed, third photoresist layer 140 is patterned by a patterning process to form a patterned first photoresist layer 140 as shown in FIG. 4C in accordance with some embodiments of the disclosure. Patterned third photoresist layer 140 is used to protect underlying first bonding layer 108 and a portion of cap substrate 102 from being etched. In some embodiments, patterned third photoresist layer 140 covers a top surface of extending portion 102a without coving the sidewalls of extending portion 102a.

Figure 4D:
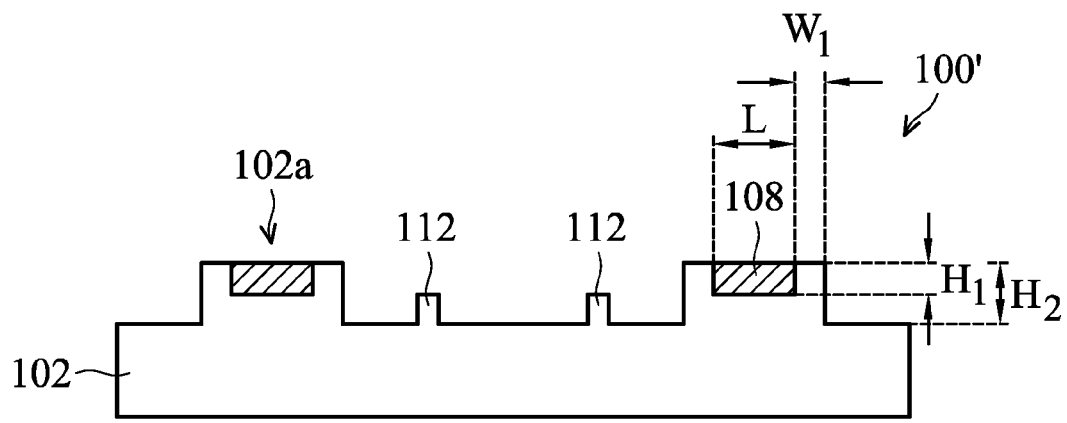

After patterned third photoresist layer 140 is formed, an etching process is performed to remove unmasked regions as shown in FIG. 4D in accordance with some embodiments of the disclosure. As a result, the height of extending portion 102a is elongated from $H_1$ to $H_2$. In some embodiments, the height ($H_2$) of extending portion 102a is greater than the height ($H_1$) of first bonding layer 108.

A portion of cap substrate 102 is removed to form a number of cap stopper 112 surrounded by extending portion 102a. Cap stopper 112 is configured to prevent movable element 202m from moving too far in the Z-direction and contacting other components or parts during a shock event. Afterwards, patterned third photoresist layer 140 is removed and cap structure 100' is formed.

Figure 5:
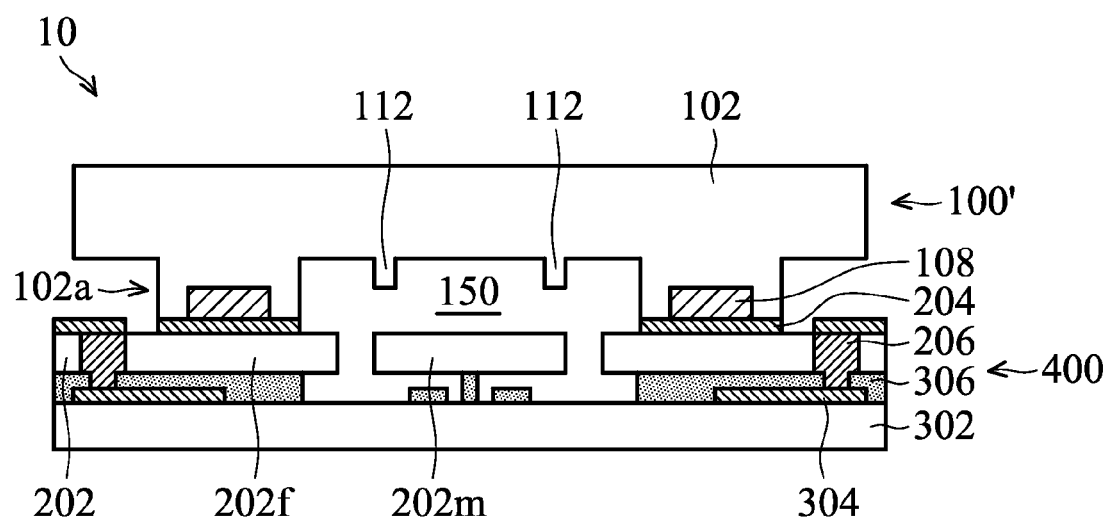
FIG. 5 shows a cross-sectional representation of a semiconductor device structure, in accordance with some embodiments of the disclosure.

FIG. 5 shows a cross-sectional representation of a semiconductor device structure, in accordance with some embodiments of the disclosure. Substrate structure 400 is bonded to cap structure 100' obtained from FIG. 4D by bonding first bonding layer 108 and second bonding layer 204. More specifically, cap substrate 102 is bonded to MEMS substrate 202 by bonding first bonding layer 108 and second bonding layer 204. In some embodiments, the bonding is performed through an eutectic bonding process. As a result, an eutectic alloy is formed between first bonding layer 108 and second bonding layer 204.

Figure 6A:
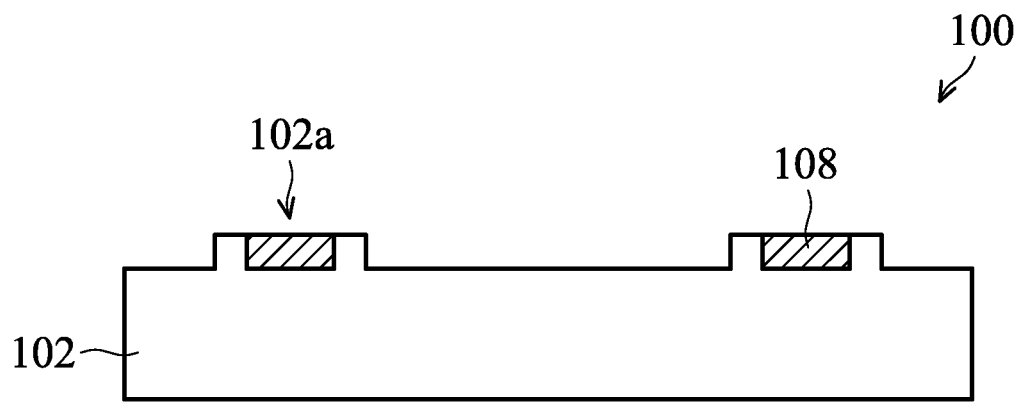
FIGS. 6A-6D show cross-sectional representations of various stages of forming a cap structure, in accordance with some embodiments of the disclosure.

FIGS. 6A-6D show cross-sectional representations of various stages of forming a cap structure 100", in accordance with some embodiments of the disclosure. The structure in FIG. 6A is the same as the structure in FIG. 1I. First bonding layer 108 is embedded in cap substrate 102.

Figure 6B:
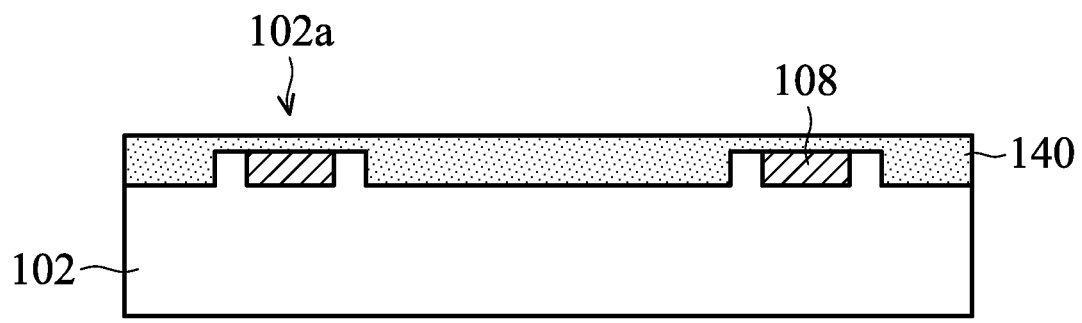

Afterwards, a third photoresist layer 140 is formed on first bonding layer 108 and cap substrate 102 as shown in FIG. 6B in accordance with some embodiments of the disclosure.

Figure 6C:
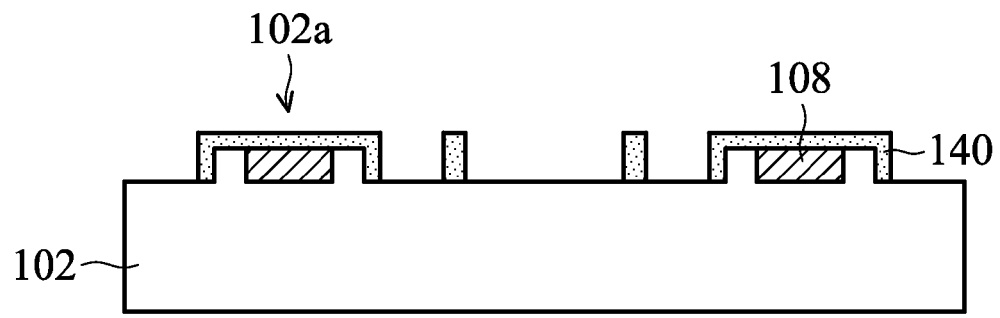

After third photoresist layer 140 is formed, third photoresist layer 140 is patterned by a patterning process to form a patterned third photoresist layer 140 as shown in FIG. 6C in accordance with some embodiments of the disclosure. Patterned third photoresist layer 140 is used to protect underlying first bonding layer 108 and a portion of cap substrate 102 from being etched. In some embodiments, the top surface and the sidewalls of extending portion 102a are covered by patterned third photoresist layer 140.

Figure 6D:
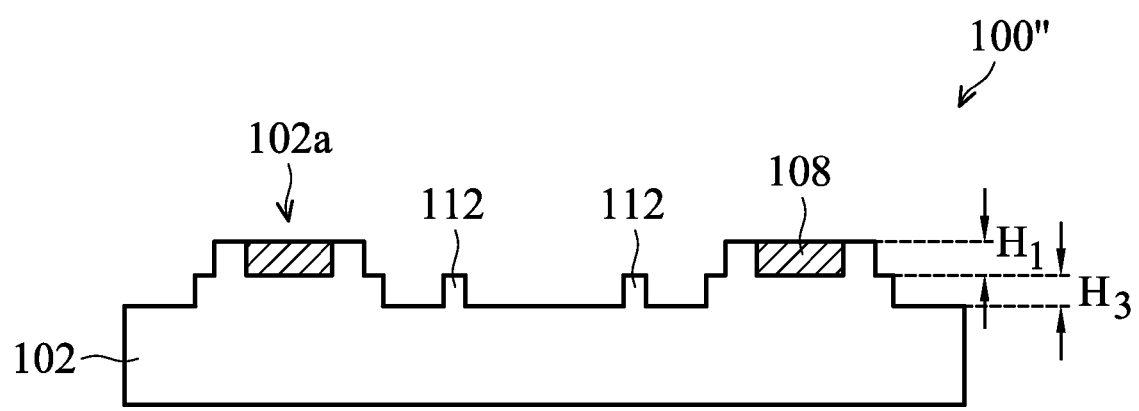

After patterned third photoresist layer 140 is formed, an etching process is performed to remove unmasked regions as shown in FIG. 6D in accordance with some embodiments of the disclosure. As a result, extending portion 102a has a stair-like shape. In addition, a number of cap stopper 112 is formed and surrounded by extending portion 102a.

As shown in FIG. 6D, stair-like shaped extending portion 102a has a first stair having a height $H_3$ and a second stair having a height $H_1$. In some embodiments, a ratio ($H_3/H_1$) of the height $H_3$ to the height $H_1$ is in a range from about 0.002 to about 100.

Figure 7:
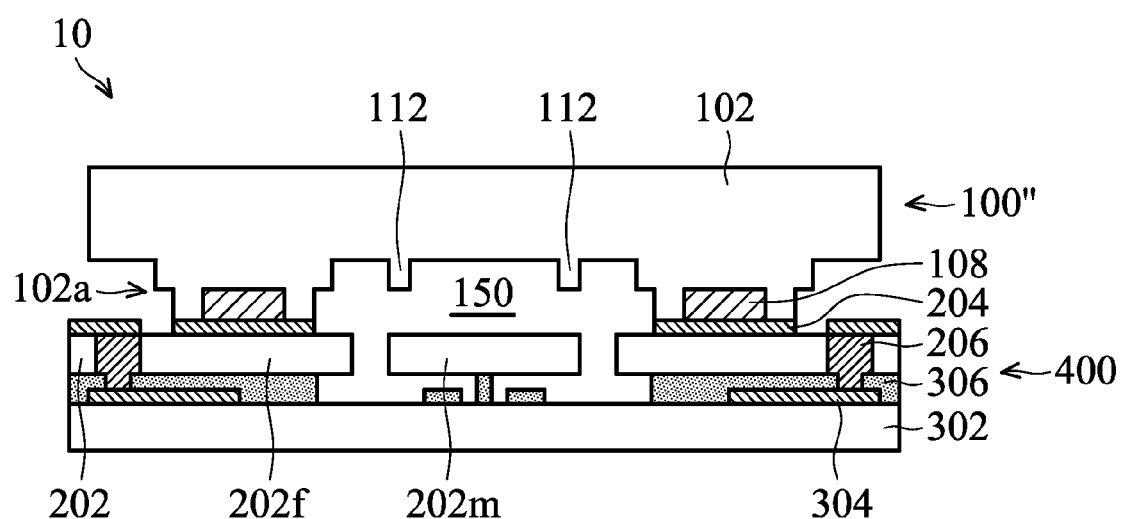
FIG. 7 shows a cross-sectional representation of a semiconductor device structure, in accordance with some embodiments of the disclosure.

FIG. 7 shows a cross-sectional representation of a semiconductor device structure, in accordance with some embodiments of the disclosure. Substrate structure 400 is bonded to cap structure 100" obtained from FIG. 6D by bonding first bonding layer 108 and second bonding layer 204. More specifically, cap substrate 102 is bonded to MEMS substrate 202 by bonding first bonding layer 108 and second bonding layer 204. In some embodiments, the bonding is performed through an eutectic bonding process.

Figure 8A:
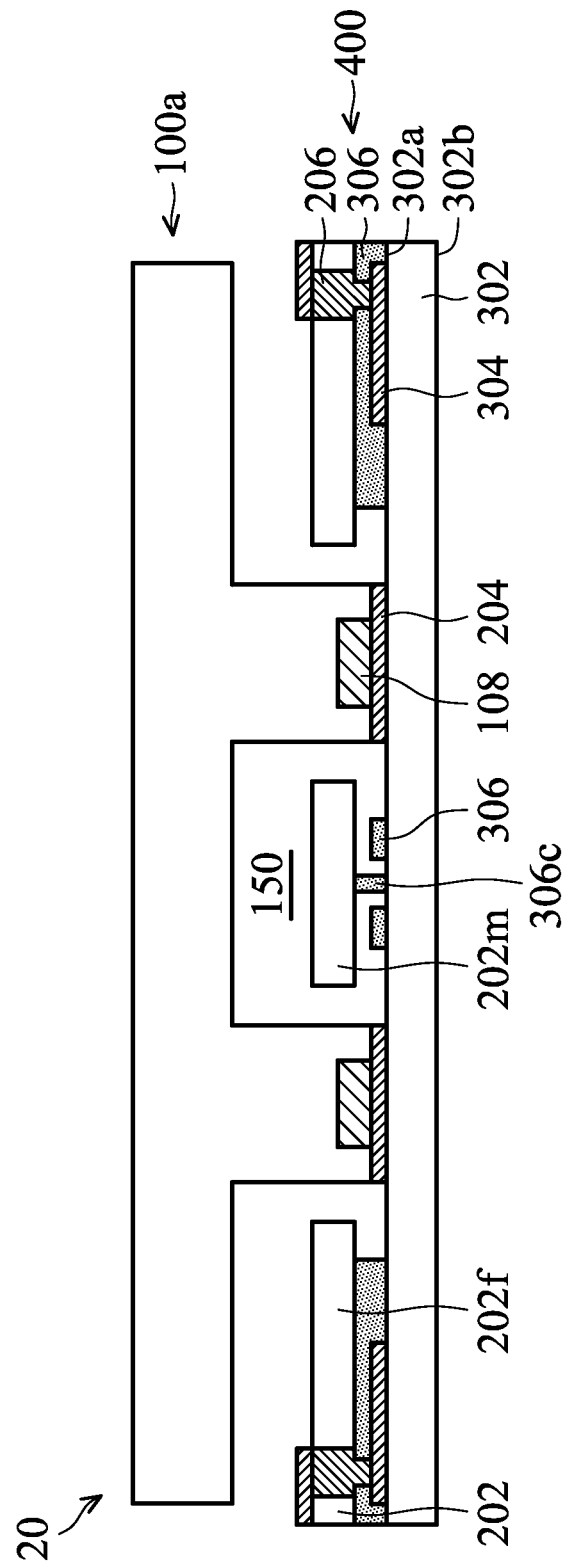
FIGS. 8A-8B show cross-sectional representations of a semiconductor device structure, in accordance with some embodiments of the disclosure.
Figure 8B:
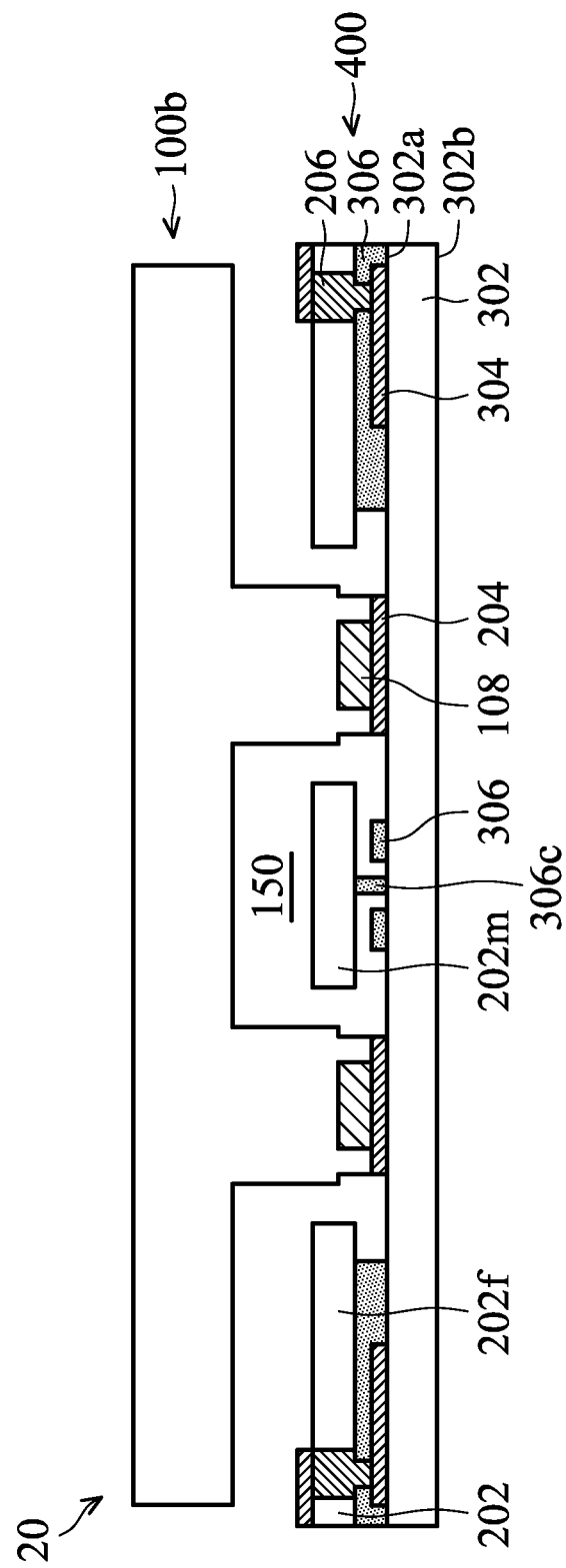

FIGS. 8A-8B show cross-sectional representations of a semiconductor device structure 20, in accordance with some embodiments of the disclosure.

As shown in FIG. 8A, semiconductor substrate 302 has a top surface 302a and a bottom surface 302b. MEMS substrate 202 is formed on top surface 302a of semiconductor substrate 302. A cap structure 100a is bonded to substrate structure 400 by bonding second bonding layer 204 to semiconductor substrate 302. Movable element 202m is surrounded by extending portion 102a of cap substrate 102 of cap structure 100a.

As shown in FIG. 8B, a cap structure 100b is bonded to substrate structure 400 by bonding second bonding layer 204 to semiconductor substrate 302. Extending portion 102a of cap substrate 102 of cap structure 100b has a stair-like shape.

It should be noted that first bonding layer 108 is embedded in cap substrate 102. Therefore, during the eutectic bonding process, the melted alloy with the liquid phase is not squeezed by the bonding force. In addition, extending portion 102a of cap substrate 102 provides a protection to first bonding layer 108, and therefore first bonding layer 108 is prevented from being oxidized and hydrolyzed.

Embodiments of a semiconductor device structure are provided. A cap structure includes a cap substrate and a first bonding layer embedded in cap substrate. A substrate structure includes a MEMS substrate and a semiconductor substrate, and a second bonding layer is formed on the MEMS substrate. The cap structure is bonded to the semiconductor substrate or the MEMS substrate by bonding first bonding layer and the second bonding layer by an eutectic bonding process to form the semiconductor device structure. Because the first bonding layer is embedded in the cap substrate, a portion of first bonding layer and/or second bonding layer is not squeezed by the eutectic bonding process. Therefore, the squeezing problem is avoided. In addition, first bonding layer is not easily oxidized and hydrolyzed when it is protected by the surrounding cap substrate. As a result, an oxidation and hydrolysis problems are also resolved. Furthermore, the quality and reliability of semiconductor device structure are improved.

In some embodiments, a semiconductor device structure is provided. The semiconductor device structure includes a cap structure. The cap structure includes: a first bonding layer and a cap substrate, and the first bonding layer is embedded in the cap substrate. The semiconductor device structure also includes a substrate structure. The substrate structure includes a substrate and a second bonding layer formed on the substrate. The substrate includes a micro-electro-mechanical system (MEMS) substrate or a semiconductor substrate. The cap structure is bonded to the substrate structure by bonding the first bonding layer and the second bonding layer.

In some embodiments, a semiconductor device structure is provided. The semiconductor device structure includes a semiconductor substrate having a top surface and a bottom surface. The semiconductor device structure also includes a micro-electro-mechanical system (MEMS) substrate formed on the top surface of the semiconductor substrate. The MEMS substrate has a first surface and a second surface and the second surface is in contact with the top surface of the semiconductor substrate. The semiconductor device structure further includes a cap substrate formed on the top surface of the semiconductor substrate or the first surface of the MEMS substrate. The cap substrate has an embedded bonding layer, and the cap substrate is bonded to the semiconductor substrate or the MEMS structure by the embedded bonding layer.

In some embodiments, a method for forming a semiconductor device structure is provided. The method includes providing a cap substrate and forming a bonding layer in the cap substrate. The method also includes forming a first photoresist layer on the cap substrate to cover the bonding layer and a portion of the cap substrate. The method further includes etching the cap substrate by using the first photoresist layer as a mask to form an extending portion. The bonding layer is embedded in the extending portion.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A semiconductor device structure, comprising:
   a substrate, wherein the substrate comprises a micro electro mechanical system (MEMS) substrate or a semiconductor substrate;
   a cap substrate disposed above the substrate, wherein the cap substrate comprises an extending portion extending from a bottom surface of the cap substrate towards the substrate;
   an eutectic alloy formed between the cap structure and the substrate, wherein at least two of the outer sidewalls of the eutectic alloy are in direct contact with the cap substrate; and
   a bonding layer formed between the cap structure and the substrate, wherein the bonding layer is in contact with the extending portion and the substrate,
   wherein the eutectic alloy is made of a first material and a second material, and the bonding layer is made of one of the first material and the second material.

2. The semiconductor device structure as claimed in claim 1, wherein the bonding layer comprises germanium (Ge), aluminum (Al), copper (Cu), titanium (Ti), nickel (Ni), silver (Ag), gold (Au), indium (In), tin (Sn), silicon (Si) or combinations thereof.

3. The semiconductor device structure as claimed in claim 1, wherein the eutectic alloy is in direct contact with the semiconductor substrate or the MEMS substrate.

4. The semiconductor device structure as claimed in claim 1, wherein the semiconductor substrate further comprises a complementary metal-oxide semiconductor (CMOS) device.

5. The semiconductor device structure as claimed in claim 1, wherein there is a distance between an edge of the eutectic alloy and an edge of the extending portion of the cap substrate when seen from a cross-sectional view.

6. The semiconductor device structure as claimed in claim 1, wherein the cap substrate further comprises a cavity surrounded by the extending portion, and the cavity is defined by an inner sidewall of the extending portion.

7. The semiconductor device structure as claimed in claim 1, wherein the cap substrate further comprises a cap stopper which is surrounded by the extending portion but is spaced apart from the extending portion.

8. The semiconductor device structure as claimed in claim 7, wherein the cap stopper is formed in the cavity.

9. The semiconductor device structure as claimed in claim 1, wherein a height of the extending portion is substantially equal to a height of the eutectic alloy.

10. The semiconductor device structure as claimed in claim 1, wherein the bonding layer is in contact with the eutectic alloy.

11. A semiconductor device structure, comprising:
    a semiconductor substrate having a top surface and a bottom surface;
    a micro-electro-mechanical system (MEMS) substrate formed on the top surface of the semiconductor substrate, wherein the MEMS substrate has a first surface and a second surface, and the second surface is in contact with the top surface of the semiconductor substrate; and
    a cap substrate formed on the top surface of the semiconductor substrate or the first surface of the MEMS substrate, wherein the cap substrate has an extending portion extending from a bottom surface of the cap substrate towards the semiconductor substrate;
    an eutectic alloy formed between the cap substrate and the MEMS substrate or between the cap substrate and the semiconductor substrate, wherein at least two of the outer sidewalls of the eutectic alloy are in direct contact with the cap substrate; and
    a bonding layer formed between the cap substrate and the MEMS substrate or between the cap substrate and the semiconductor substrate, wherein the bonding layer is in contact with the extending portion and one of the MEMS substrate and the cap substrate,
    wherein the eutectic alloy is made of a first material and a second material, and the bonding layer is made of one of the first material and the second material.

12. The semiconductor device structure as claimed in claim 11, wherein a portion of the eutectic alloy is surrounded by the bonding layer.

13. The semiconductor device structure as claimed in claim 11, wherein the extending portion has a stair shape.

14. The semiconductor device structure as claimed in claim 11, wherein the height of the extending portion is greater than the height of the eutectic alloy.

15. The semiconductor device structure as claimed in claim 11, wherein the eutectic alloy has a ring structure.

16. The semiconductor device structure as claimed in claim 11, wherein a portion of the eutectic alloy is surrounded by the extending portion.

17. The semiconductor device structure as claimed in claim 11, wherein an edge of the eutectic alloy is not aligned with an edge of the extending portion when seen from a cross-sectional view.

18. The semiconductor device structure as claimed in claim 11, wherein the bonding layer is in contact with the eutectic alloy.

19. A semiconductor device structure, comprising:
- a semiconductor substrate;
- a MEMS substrate formed over the semiconductor substrate;
- a cap substrate formed over the MEMS structure, wherein the cap substrate comprises an extending portion extending from a bottom surface of the cap substrate towards the semiconductor substrate;
- an eutectic alloy formed between the cap substrate and the MEMS substrate, wherein at least two of the outer sidewalls of the eutectic alloy are in direct contact with the cap substrate; and
- a bonding layer formed between the cap substrate and the MEMS substrate, wherein the bonding layer is in contact with the extending portion and the MEMS substrate, the eutectic alloy is made of a first material and a second material, and the bonding layer is made of one of the first material and the second material.

20. The semiconductor device structure as claimed in claim 19, wherein the bonding layer is in contact with the eutectic alloy.

* * * * *